US 6,535,430 B2

(12) United States Patent
Ogura et al.

(10) Patent No.: US 6,535,430 B2
(45) Date of Patent: Mar. 18, 2003

(54) WORDLINE DECODER FOR FLASH MEMORY

(75) Inventors: Tomoko Ogura, Wappingers Falls, NY (US); Masaharu Kirihara, Beacon, NY (US)

(73) Assignee: Halo, Inc., Wappingers Falls, NY (US)

( * ) Notice: Subject to any disclaimer, the term of this patent is extended or adjusted under 35 U.S.C. 154(b) by 0 days.

(21) Appl. No.: 09/785,608

(22) Filed: Feb. 16, 2001

(65) Prior Publication Data

US 2001/0053093 A1 Dec. 20, 2001

Related U.S. Application Data

(60) Provisional application No. 60/182,877, filed on Feb. 16, 2000.

(51) Int. Cl.⁷ ................................................ G11C 16/06
(52) U.S. Cl. ............................. 365/185.23; 365/189.11; 365/185.27
(58) Field of Search ...................... 365/185.23, 230.03, 365/189.11, 185.27, 185.18, 189.09, 240, 230.06; 327/333; 326/62

(56) References Cited

U.S. PATENT DOCUMENTS

| 5,602,797 A | 2/1997 | Kang | 365/230.06 |
|---|---|---|---|
| 5,818,790 A | 10/1998 | Kim et al. | 365/230.06 |
| 5,870,348 A * | 2/1999 | Tomishima et al. | 365/230.06 |
| 5,889,724 A | 3/1999 | Khang et al. | 365/230.03 |
| 5,966,331 A * | 10/1999 | Shiau et al. | 365/185.23 |
| 6,044,020 A * | 3/2000 | Chung et al. | 365/185.23 |
| 6,166,957 A * | 12/2000 | Chung et al. | 365/185.23 |
| 6,242,962 B1 * | 6/2001 | Nakamura | 326/62 |

* cited by examiner

*Primary Examiner*—David Lam
(74) *Attorney, Agent, or Firm*—George O. Saile; Stephen B. Ackerman

(57) ABSTRACT

A wordline decoder for high density flash memory is described with negative voltage capability for memory operations such as erase. A main decoder is shared with a plurality of wordline driver circuits to reduce wiring congestion and overall layout size. In a second embodiment, a wordline decoder for fast read access is provided in which a high speed positive voltage decoder is separate from the negative voltage decoder with the addition of a triple well NMOS transistor into the inverter driver circuits. The use of triple well NMOS transistors reduces circuit and layout complexity.

13 Claims, 4 Drawing Sheets

WORDLINE DECODER FOR FLASH MEMORY

This application claims the benefit of Provisional Application Ser. No. 60/182,877, filed Feb. 16, 2000.

BACKGROUND OF THE INVENTION

1. Field of Invention

The present invention relates to semiconductor memory wordline decoders and more particularly to wordline decoders for flash memory.

2. Description of Related Art

Memory cells in a conventional cross-point memory array are arranged such that the control gates of cells on the same row share a common word line in the x-direction and the drain of cells on a same column share a common bit line in the y-direction. A single word can be accessed by a unique word line address and unique bit decode address. Depending upon the application, design of the word line decoder circuit and layout may be a challenging task. In SRAM applications, the voltage applied to the word line is usually VDD, the positive power supply voltage. SRAM's are optimized for fast access, so the decoding circuits are often dynamic and sized for speed. Although fast word line access is not as critical for DRAM, an additional boosted word line capability must be included within a very small memory cell pitch. In some flash memory applications, negative word line voltage decoding may be required in addition to fast access and high voltage word line decoding.

In U.S. Pat. No. 5,889,724 (Khang et al.) a wordline driving circuit is directed toward a hierarchial scheme to reduce wordline loading. U.S. Pat. No. 5,818,790 (Kim et al.) is directed toward a method for driving wordlines in a semiconductor memory device where a main row decoder generates a wordline enable signal in response to part of an address signal and a sub row decoder generates a wordline boosting signal from another part of the address signal. U.S. Pat. No. 5,602,797 (Kang) relates to improved wordline driving circuit for a memory capable of decoding a free-decoded low address to an externally applied voltage level and driving a wordline using a memory power up voltage level.

FIG. 1 shows a diagram of a prior art word line decoder for a semiconductor memory. Each word line WL is decoded 10 by a set of pre-decoded signals, and a level shifter 11 then "shifts" the logic signal voltage to its proper word line voltage. However, unless there are a sufficient number of wiring levels, the layout of the circuit of FIG. 1 may be difficult to fit within a small memory cell pitch.

Layout is simplified for the circuit shown in FIG. 2, because the main decoder 21 is shared by several drivers 22. The driver is a CMOS inverter with a decoded power supply Vdp. In addition to the inverter, there maybe a pull down NMOS device MN5 between the wordline and ground. The gate of MN5 is opposite in polarity to the decoded power supply. The function of the pull down device is to prevent the word line WL0 (representing all wordlines) from floating when both the PMOS and NMOS devices are off. Although the layout for the circuit in FIG. 2 is smaller and easier than FIG. 1, it does not allow for high voltage or negative voltage decoding.

SUMMARY OF THE INVENTION

It is an objective of the present invention to provide a wordline decoder for high density flash memory. It is further an objective of the present invention to provide negative wordline voltage to accommodate flash memory operations. It is also an objective of the present memory to provide a wordline decoder for fast read access.

In flash memory, unlike a DRAM and SRAM, negative voltages may be required during read and erase operations. During read or verification operations, because memory cell thresholds can be less than zero, it may be desirable to apply a negative bias voltage to the selected word lines. This negative voltage may be about −1 V or −2 V, depending on the array threshold distribution characteristics. Also, applying a negative voltage to the word gate during erase has been demonstrated as an effective way to reduce the maximum voltage requirement for F–N tunneling. A negative voltage of about −4 V to −8 V may be applied to a several word lines simultaneously for block erase.

A positive high voltage may be needed during pro gram, in order to inject electrons into the floating gate. This voltage may be between 5 V to 20 V, depending on the device type and the mechanism for injection. Thus the word line decoder must be able to supply high positive voltages as well as negative voltages.

BRIEF DESCRIPTION OF THE DRAWINGS

This invention will be described with reference to the accompanying drawings, wherein.

DETAILED DESCRIPTION OF THE PREFERRED EMBODIMENT

Figure 3:
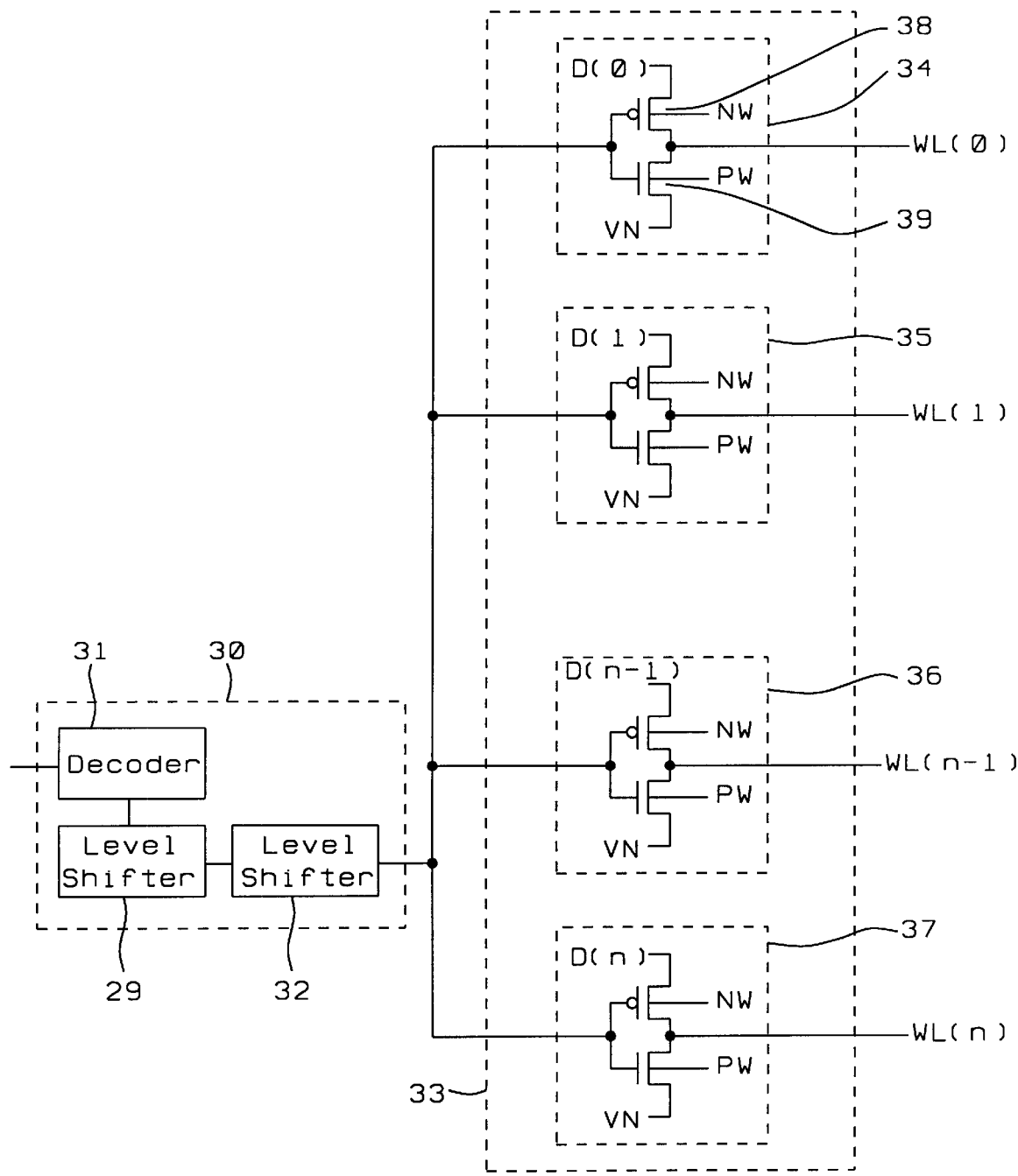
FIG. 3 is a schematic diagram of the first embodiment of the present invention.

In FIG. 3 is shown a word line decoder with positive and negative voltage capability that is also able to fit within a small memory cell layout pitch. There are two main elements to the word line decoder, the main body 30, which includes the main decoder 31 and the level shifters 29 and 32, and the distributed drivers 33. A single main body 30 which occupies a large layout, can be shared with several word lines WL(0), WL(1) ... WL(n−1), WL(n), by decoding the power supply to the distributed drivers 34, 35, 36 and 37. The number of wordlines "n" can be $2^1$, $2^2$, $2^3$ or greater, depending on the ratio of the single driver layout height to the height of the memory cell The signals D(0), D(1) ... D(n−1) and D(n) are voltages that have been pre-decoded with the least significant bits of the word line addressing bits. The advantage of this shared arrangement is that layout is easier, requiring less wiring metal and occupying less space than if each word line had it own main body.

Figure 1:
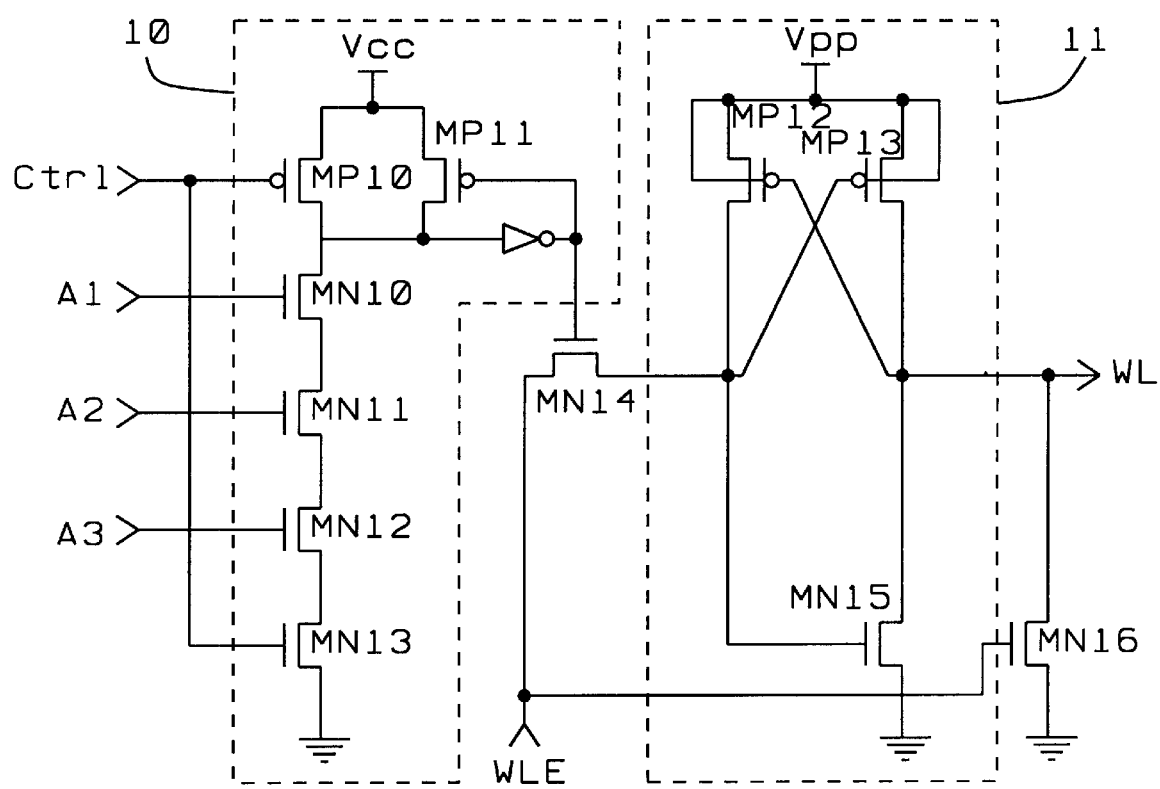
FIG. 1 is a wordline decoder of prior art.
Figure 2:
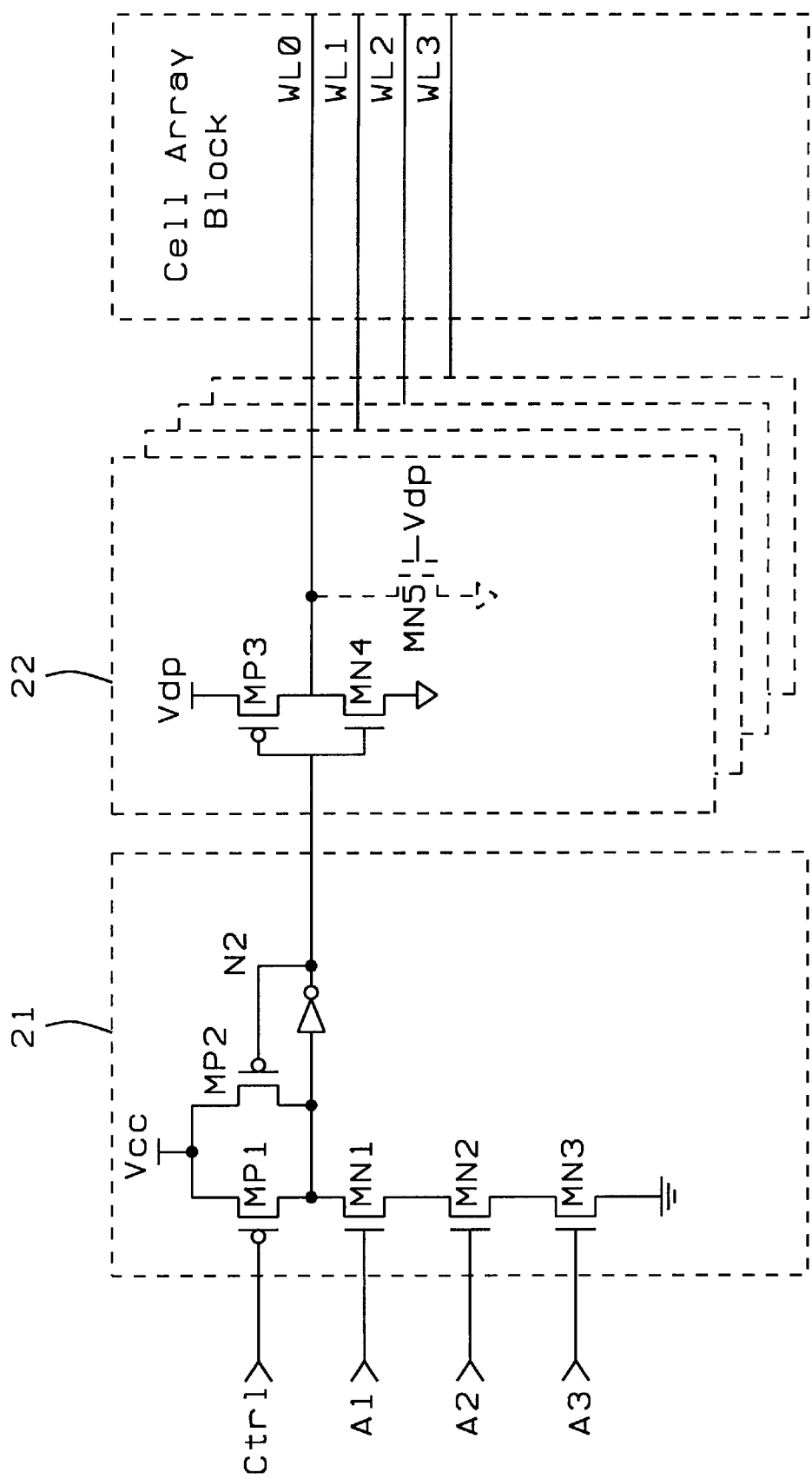
FIG. 2 is a distributed driver wordline decoder of prior art.

Continuing to refer to FIG. 3, a single driver represented by wordline driver 34 is an inverter made up a PMOS transistor 38 and a triple well NMOS device 39. Unlike the conventional distributed decoder strategy shown in FIG. 2, the NMOS device of the inverter is a triple well device, which is biased with a voltage PW. Also the driver does not require a third pull down NMOS transistor. The PMOS transistor 38 resides in an N-well and is biased with a voltage NW. The power supply to the source of the PMOS transistor 38 is a decoded voltage D(0). This decoded voltage D(0) swings between VDHI which is the selected word line voltage and VDLO, the voltage for the word line when it is unselected. The voltage VN is the predetermined voltage for the unselected word lines. Because a triple well NMOS device is used, VN can range from zero to a negative voltage. In order to avoid forward biasing of the triple well, PW must be the same voltage as or more negative than VN. Also, the output of the level shifter needs to switch between VDHI and VDLO-Vtp where Vtp is the threshold of the PMOS transistor. With this voltage constraint, it is not necessary to add the third NMOS pull down transistor, and the word line will always be at voltages VDHI or VDLO.

Figure 4:
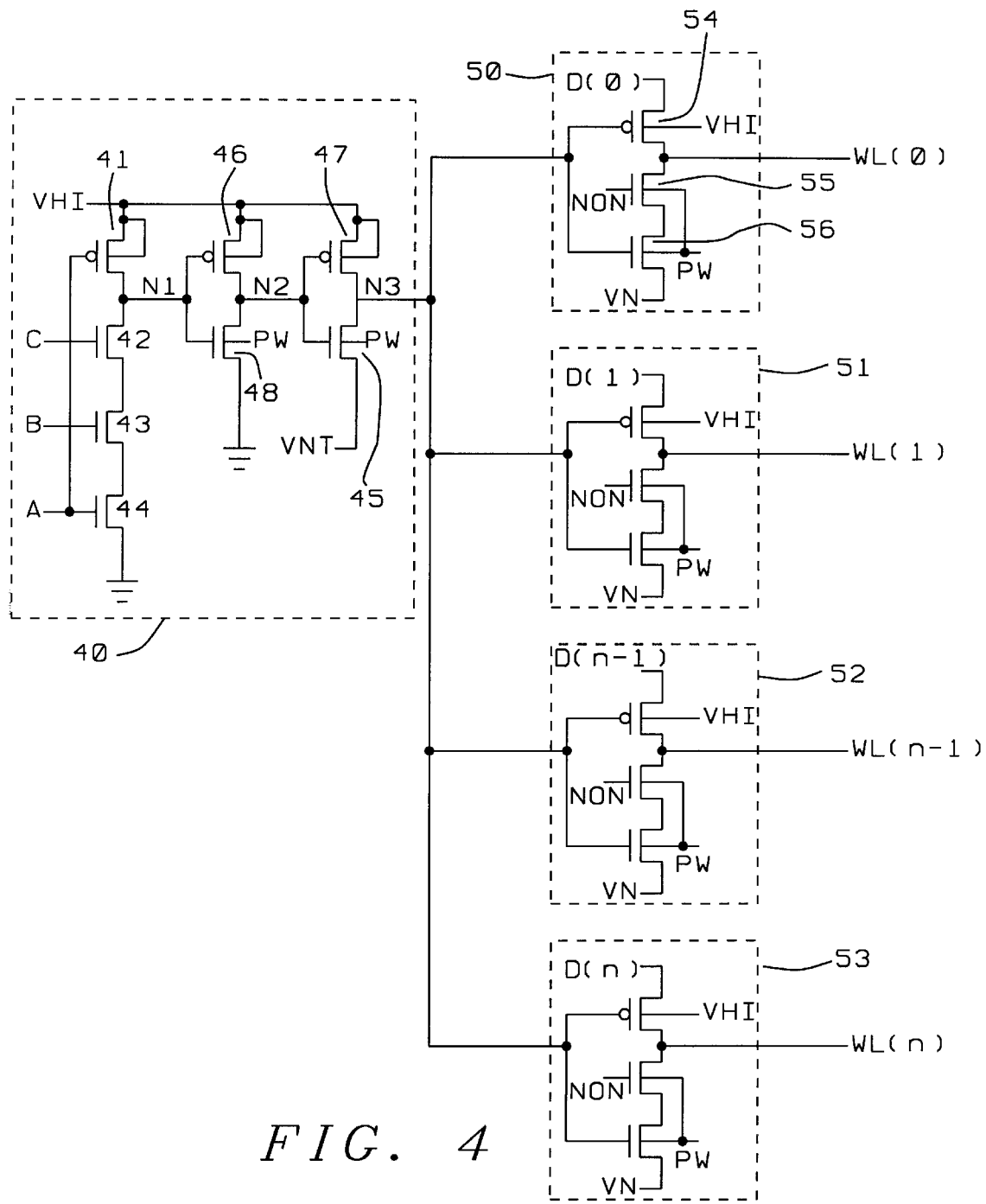
FIG. 4 is a schematic diagram of the second embodiment of the present invention.

In the second embodiment of this invention, shown in FIG. 4. The second embodiment comprises a wordline decoder and level shifter 40 and a plurality of wordline drivers 50, 51, 52 and 53. The decoder comprises and PMOS transistor 41 connected in series with NMOS transistors 42, 43 and 44, and two inverters comprising transistors 46 and 48, and 45 and 47. Inputs to transistors 41, 42 and 43 are derived from signals A, B and C. A wordline driver 50, representing the other wordline drivers, has a three transistor tri-state inverter made from the interconnections of a PMOS transistor 54, and two NMOS transistors 55 and 56. The two NMOS transistors reside in a triple well, which is biased with a voltage PW. The PMOS transistor 54 resides in a P well where the P-well is biased to a voltage VHI. VHI is a voltage as high or higher than the wordline voltage VDHI. The second triple well NMOS transistor 55, used as a switch, is inserted between the PMOS transistor 54 and triple well NMOS transistor 56 in the inverter of the previous embodiment. In the second embodiment, the wordline drivers are used only for positive high voltage decoding during program and read access.

Continuing to refer to FIG 4, the addition of the NMOS switch 55 into the inverter of the wordline driver 51 allows the negative level shifter to be separate from the circuitry of the wordline decoder and drivers. The switch is gated by a signal NON when a negative wordline voltage is needed. This allows fast access read, using inverters only with the slower level shifter providing the negative voltage not in the critical access path. It should be noted that if VNT=VN= GND, then when nodes N1=N2=N3=0 and D(0)=0, WL(0) will experience a floating condition. However, if transistor 45 is a triple well NMOS device with a high threshold voltage of about 2V, then it is possible to make VNT=−2V with no leakage. Then node N3 will swing between VDHI and −2V, and the word lines will never experience a floating condition. Another alternative to using [the] a high threshold triple well transistor 45, is to use a normal NMOS transistor and add pull down NMOS transistor on the word line.

While the invention has been particularly shown and described with reference to preferred embodiments thereof, it will be understood by those skilled in the art that various changes in form and details may be made without departing from the spirit and scope of the invention.

What is claimed is:

1. A wordline decoder, comprising:
   a decoder circuit,
   a first and a second level shifter connected in series,
   a plurality of wordline drivers, each of said wordline drivers further comprising a PMOS device in an N-well and an NMOS device in a triple well,
   said decoder circuit selects said wordline drivers by controlling a decoded bias voltage connected to said PMOS device,
   output of said second level shifter connected to said wordline drivers to produce a high and a low wordline voltage,
   said NMOS device biased with a negative voltage to produce a voltage for unselected wordlines.

2. A wordline decoder, comprising:
   a decoder circuit,
   a first and a second level shifter connected in series,
   a plurality of wordline drivers,
   said decoder circuit selects said wordline drivers,
   output of said second level shifter connected to said wordline drivers to produce a high and a low wordline voltage,
   said wordline drivers biased with a negative voltage to produce a voltage for unselected wordlines.
   said wordline drivers are inverter circuits, further comprising:
      a PMOS transistor contained within an N-well,
      an NMOS transistor contained within a triple well,
      a decoded voltage connected to source of said PMOS transistor,
      a negative voltage connected to source of said NMOS transistor,
      gates of said PMOS and NMOS transistors connected together to form wordline driver input,
      drains of said PMOS and NMOS transistors connected together to form wordline driver output.

3. The decoder of claim 2, wherein said decoded voltage is a high wordline voltage when the wordline driver is selected and a low wordline voltage when the wordline driver is not selected.

4. The decoder of claim 2, wherein said triple well allows said wordline driver output to be a negative voltage.

5. A circuit to decode and drive wordlines for flash memory, comprising:
   a decoder,
   a level shifter circuit,
   a wordline driver,
   said decoder drives the wordline driver through said level shifter circuit,
   said level shifter circuit comprising a first inverter circuit and a second inverter circuit biased between a high positive voltage and a negative voltage,
   said wordline driver comprises a tri-state inverter circuit that produces a high positive wordline voltage, a low wordline voltage and a negative wordline voltage,
   output of said level shifter circuit connected to inputs of a plurality of wordline driver circuits.

6. The circuit of claim 5, wherein said first inverter circuit and said second inverter circuit comprise a PMOS transistor in an N-well and an NMOS transistor in a P-well and source of said NMOS transistor in said second inverter circuit is biased to a negative voltage to produce a level shifter output that switches between said high wordline voltage and said negative wordline voltage.

7. The circuit of claim 5, wherein the wordline driver further comprises:
   a PMOS transistor within an N-well,
   a first NMOS transistor within a triple well,
   a second NMOS transistor within a triple well,
   gates of said PMOS transistor and said first NMOS transistor connected together to form input to the word line driver,
   source of said PMOS transistor connected to a decoded voltage,
   drain of said PMOS transistor and drain of said second NMOS transistor connected together to form output of the word line driver, source of said second NMOS transistor connected to drain of said first NMOS transistor, wherein said second NMOS transistor is connected in series with said first NMOS transistor, source of said first NMOS transistor connected to a negative voltage, gate of said second NMOS transistor connected to a control voltage.

8. The circuit of claim 7, wherein the N-well is biased to a voltage equal to a selected wordline high voltage.

9. The circuit of claim 7, wherein said control voltage connects said negative voltage to be connected to output of said wordline driver.

10. The circuit of claim 7, wherein bias for said triple well must be the same or more negative than said negative voltage.

11. A wordline decoder, comprising:

a decoding means, a level shifting means, a driver means, a negative voltage selector means, said decoding means selecting a wordline by controlling a decoded voltage connected to said driver means, said level shifting means comprising a first inverter circuit and a second inverter circuit and providing an input to said driver means, said driver means providing an output voltage to be applied to said wordline, said negative voltage selector means connecting said output voltage of a negative value to said wordline.

12. The wordline decoder of claim 11, wherein said level shifting means is biased to produce said input to said driver means that switches between a positive voltage and a negative voltage.

13. A wordline decoder, comprising:

a decoding means, a level shifting means, a driver means, a negative voltage selector means, said decoding means selecting a wordline, said level shifting means comprising a first inverter circuit and a second inverter circuit and providing an input to said driver means, said driver means providing a voltage to be applied to said wordline, said negative voltage selector means connecting a negative voltage to said word line, said driver means is a tri-state inverter with a second NMOS transistor inserted to select said negative voltage.

* * * * *